(12) United States Patent
Wang et al.

(10) Patent No.: US 12,087,246 B2
(45) Date of Patent: Sep. 10, 2024

(54) DISPLAY SUBSTRATE, METHOD FOR DRIVING THE SAME AND DISPLAY PANEL

(71) Applicants: Nanjing BOE Display Technology CO., LTD., Jiangsu (CN); BOE Technology Group Co., Ltd., Beijing (CN)

(72) Inventors: Jie Wang, Beijing (CN); Honggang Gu, Beijing (CN); Xu Chen, Beijing (CN); Haihong Wang, Beijing (CN)

(73) Assignees: Nanjing BOE Display Technology CO., LTD., Jiangsu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/014,578

(22) PCT Filed: Dec. 29, 2021

(86) PCT No.: PCT/CN2021/142413
§ 371 (c)(1),
(2) Date: Jan. 5, 2023

(87) PCT Pub. No.: WO2023/123032
PCT Pub. Date: Jul. 6, 2023

(65) Prior Publication Data
US 2024/0265888 A1 Aug. 8, 2024

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0408* (2013.01); *G09G 2310/0286* (2013.01)

(58) Field of Classification Search
CPC ......... G09G 3/3677; G09G 2300/0408; G09G 2310/0286; G11C 19/28
USPC .......................................................... 345/213
See application file for complete search history.

(56) References Cited

U.S. PATENT DOCUMENTS

| | | | |
|---|---|---|---|
| 2010/0231492 A1 | 9/2010 | Moon et al. | |
| 2018/0090090 A1* | 3/2018 | Feng | G09G 3/3622 |
| 2019/0073932 A1* | 3/2019 | Huang | G09G 3/3666 |

(Continued)

FOREIGN PATENT DOCUMENTS

| | | |
|---|---|---|
| CN | 101013725 A | 8/2007 |
| CN | 103236245 A | 8/2013 |
| CN | 104732935 A | 6/2015 |

(Continued)

*Primary Examiner* — Calvin C Ma
(74) *Attorney, Agent, or Firm* — IPro, PLLC

(57) ABSTRACT

A display substrate, a method for driving the same and a display device are provided. The display substrate includes a gate driving circuit, the gate driving circuit includes a plurality of shift register units, the shift register unit includes a pull-up node, a pull-down node and a pull-up control sub-circuit; the pull-up control sub-circuit includes: a first dual-gate transistor, a first gate electrode of the first dual-gate transistor and a second gate electrode of the first dual-gate transistor being respectively coupled to the pull-down node, a first electrode of the first dual-gate transistor being coupled to the pull-up node, and a second electrode of the first dual-gate transistor being coupled to a first level signal input terminal.

20 Claims, 8 Drawing Sheets

(56) References Cited

U.S. PATENT DOCUMENTS

2021/0225251 A1    7/2021  Xu et al.

FOREIGN PATENT DOCUMENTS

| CN | 109427310 | A  | 3/2019  |
|----|-----------|----|---------|
| CN | 110111743 | B  | 11/2020 |
| CN | 113053447 | A  | 6/2021  |
| JP | 2008191517| A  | 8/2008  |
| WO | 2021179329| A1 | 9/2021  |

\* cited by examiner

DISPLAY SUBSTRATE, METHOD FOR DRIVING THE SAME AND DISPLAY PANEL

CROSS-REFERENCE TO RELATED APPLICATION

This application is the U.S. national phase of PCT Application No. PCT/CN2021/142413 filed on Dec. 29, 2021, which is incorporated herein by reference in its entirety.

TECHNICAL FIELD

The present disclosure relates to the field of display technology, in particular to a display substrate, a method for driving the same and a display panel.

BACKGROUND

With the continuous development of display technology, high resolution and narrow borders have become the trend of display product development. At the same time, in order to save production costs, Gate Driver on Array (GOA) technology is generally used. This technology does not require a gate driver chip on the display substrate, which saves material costs.

SUMMARY

The objective of the present disclosure is to provide a display substrate, a method for driving the same and a display panel.

In order to achieve the objective, the present disclosure provides the following technical solutions.

In a first aspect, the present disclosure provides in some embodiments a display substrate, comprising a gate driving circuit, wherein the gate driving circuit includes a plurality of shift register units, the shift register unit includes a pull-up node, a pull-down node and a pull-up control sub-circuit: the pull-up control sub-circuit includes: a first dual-gate transistor, a first gate electrode of the first dual-gate transistor and a second gate electrode of the first dual-gate transistor being respectively coupled to the pull-down node, a first electrode of the first dual-gate transistor being coupled to the pull-up node, and a second electrode of the first dual-gate transistor being coupled to a first level signal input terminal.

Optionally, the shift register unit further comprises an output control sub-circuit, and the output control sub-circuit includes a second dual-gate transistor, and a first gate electrode of the second dual-gate transistor and a second gate electrode of the second dual-gate transistor are respectively coupled to the pull-up node, and a first electrode of the second dual-gate transistor is coupled to a corresponding clock signal input terminal, a second electrode of the second double-gate transistor is coupled to a driving signal output terminal of the shift register unit.

Optionally, the shift register unit further includes: an output reset sub-circuit, wherein the output reset sub-circuit is respectively coupled to the pull-down node, a driving signal output terminal of the gate driving circuit, and the first level signal input terminal, the output reset sub-circuit is configured to control to connect or disconnect the driving signal output terminal and the first level signal input terminal under the control of the pull-down node: a storage sub-circuit, wherein a first terminal of the storage sub-circuit is coupled to the pull-up node, and a second terminal of the storage capacitor is coupled to the driving signal output terminal.

Optionally, the shift register unit further comprises a pull-down control sub-circuit, the pull-down control sub-circuit is respectively coupled to the pull-up node, the pull-down node, the first level signal input terminal and a second level signal input terminal, and the pull-down control sub-circuit is configured to control connect or disconnect the pull-down node and the first level signal input terminal under the control of the pull-up node, and configured to control to connect or disconnect the pull-down node and the second level signal input terminal under the control of the second level signal input terminal.

Optionally, the shift register unit further includes: an input sub-circuit, wherein the input sub-circuit is respectively coupled to an input control terminal, an input signal terminal and the pull-up node, and the input sub-circuit is configured to control to connect or disconnect the input signal terminal and the pull-up node under the control of the input control terminal.

Optionally, the output reset sub-circuit includes a third transistor, a gate electrode of the third transistor is coupled to the pull-down node, and a first electrode of the third transistor is coupled to the driving signal output terminal, and a second electrode of the third transistor is coupled to the first level signal input terminal: the storage sub-circuit includes a storage capacitor, a first terminal of the storage capacitor is coupled to the pull-up node, and a second terminal of the storage capacitor is coupled to the driving signal output terminal.

Optionally, the pull-down control sub-circuit includes a fourth transistor and a fifth transistor, and a gate electrode of the fourth transistor and a first electrode of the fourth transistor are both coupled to the second level signal input terminal, a second electrode of the fourth transistor is coupled to the pull-down node: a gate electrode of the fifth transistor is coupled to the pull-up node, a first electrode of the fifth transistor is coupled to the pull-down node, and a second electrode of the fifth transistor is coupled to the first level signal input terminal.

Optionally, the input sub-circuit includes a sixth transistor, a gate electrode of the sixth transistor is coupled to the input control terminal, and a first electrode of the sixth transistor is coupled to the input signal terminal, a second electrode of the sixth transistor is coupled to the pull-up node.

Optionally, the display substrate includes a plurality of gate lines, a plurality of data lines and a plurality of sub-pixels, the sub-pixel includes a pixel circuit and a pixel electrode, and the pixel circuit includes a pixel double-gate transistor, a first gate electrode of the pixel double-gate transistor and a second gate electrode of the pixel double-gate transistor are respectively coupled to corresponding gate lines, and a first electrode of the pixel double-gate transistor is coupled to a corresponding data line, and a second electrode of the pixel double-gate transistor is coupled to the pixel electrode.

Optionally, the first double-gate transistor, the second double-gate transistor and the pixel double-gate transistor adopt the following structures: a first gate electrode, a first insulating layer, an active layer, a source-drain metal layer, a second insulating layer and a second gate electrode stacked along a direction away from a base substrate of the display substrate: an orthographic projection of the active layer on the base substrate at least partially overlaps an orthographic projection of the first gate electrode on the base substrate, the orthographic projection of the active layer on the base substrate at least partially overlaps an orthographic projection of the second gate electrode on the base substrate: the source-drain metal layer forms a first electrode and a second electrode of a transistor, the first electrode and the second electrode are respectively lapped on the active layer.

In a second aspect, the present disclosure provides in some embodiments a method for driving a display substrate, applied to the display substrate, including: in an input phase, an output phase and a reset phase, controlling the first dual-gate transistor to be turned off by the first gate electrode and the second gate electrode of the first dual-gate transistor under the control of the pull-down node: in a maintenance phase, controlling the first dual-gate transistor to be turned on by the first gate electrode and the second gate electrode of the first dual-gate transistor under the control of the pull-down node.

Optionally, the shift register unit further comprises an output control sub-circuit, the output control sub-circuit includes a second dual-gate transistor, a first gate electrode of the second dual-gate transistor and a second gate electrode of the second dual-gate transistor are respectively coupled to the pull-up node, a first electrode of the second dual-gate transistor is coupled to a corresponding clock signal input terminal, and a second electrode of the second dual-gate transistors is coupled to a driving signal output terminal of the gate driving circuit: the method further includes: in the input phase, the output phase and the reset phase, controlling the second double-gate transistor to be turned on by the first gate electrode and the second gate electrode of the second double-gate transistor under the control of the pull-up node: in the maintenance phase, controlling the second dual-gate transistor to be turned off by the first gate electrode and the second gate electrode of the second dual-gate transistor under the control of the pull-up node.

Optionally, the display substrate includes a plurality of gate lines, a plurality of data lines and a plurality of sub-pixels, the sub-pixel includes a pixel circuit and a pixel electrode, and the pixel circuit includes a pixel double-gate transistor, a first gate electrode of the pixel double-gate transistor and a second gate electrode of the pixel double-gate transistor are respectively coupled to a corresponding gate line, and a first electrode of the pixel double-gate transistor is connected to a corresponding data line, and a second electrode of the pixel double-gate transistor is coupled to the pixel electrode: the method further includes: in a pixel driving phase, controlling the pixel double-gate transistor to be turned on by the first gate electrode and the second gate electrode of the pixel double-gate transistor under the control of the corresponding gate line: in a non-pixel driving phase, controlling the pixel double-gate transistor to be turned off by the first gate electrode and the second gate electrode of the pixel double-gate transistor under the control of the corresponding gate line.

In a third aspect, the present disclosure provides in some embodiments a display panel including the display substrate.

Optionally, the display panel further comprises an opposite substrate and a liquid crystal layer, the opposite substrate is arranged opposite to the display substrate, and the liquid crystal layer is arranged between the opposite substrate and the display substrate.

BRIEF DESCRIPTION OF THE DRAWINGS

The accompanying drawings described herein are used to provide further understanding of the present disclosure and constitute a part of the present disclosure. The exemplary embodiments of the present disclosure and their descriptions are used to explain the present disclosure and do not constitute an improper limitation of the present disclosure.

DETAILED DESCRIPTION

In order to further illustrate the display substrate, the driving method thereof, and the display panel provided by the embodiments of the present disclosure, a detailed description is given below with reference to the accompanying drawings.

The present disclosure provides a display substrate including a display area and a non-display area surrounding the display area. The display area includes a plurality of sub-pixels, and each sub-pixel includes a thin film transistor, and the thin film transistor can drive the sub-pixel to realize a display function. The non-display area includes a GOA circuit. The GOA circuit generally includes a plurality of shift register units, and each stage of shift register unit includes several thin film transistors.

In order to better ensure the working performance of the thin film transistor, the thin film transistor is expected to have a larger current when it is turned on, and can be turned off well to avoid false turning-on. The leakage current is as small as possible when the thin film transistor is in the off state.

In the off state, the threshold voltage (Vth) of the thin film transistor needs to be relatively large to meet the purpose of preventing false turning-on and reducing leakage current: while the Vth of the thin film transistor needs to be relatively small when it is turned on to meet the large current in the on state. In this way, the Vth of the thin film transistor needs to be dynamically adjustable according to the on or off state, but the Vth of the current traditional thin film transistor cannot be changed after the process is completed. It should be noted that the Vth drift caused by the long-term working stress of the thin film transistor is not considered, and this drift is only the change of the initial Vth of the thin film transistor, and the Vth cannot be dynamically adjusted according to the on/off state requirements of the thin film transistor.

Figure 2:
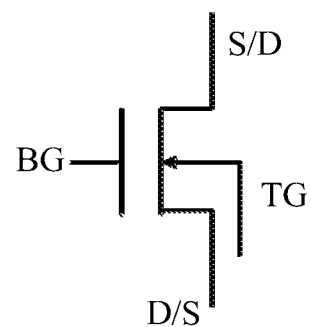
FIG. 2 is a circuit symbol diagram of a dual-gate transistor provided by an embodiment of the present disclosure.
Figure 6:
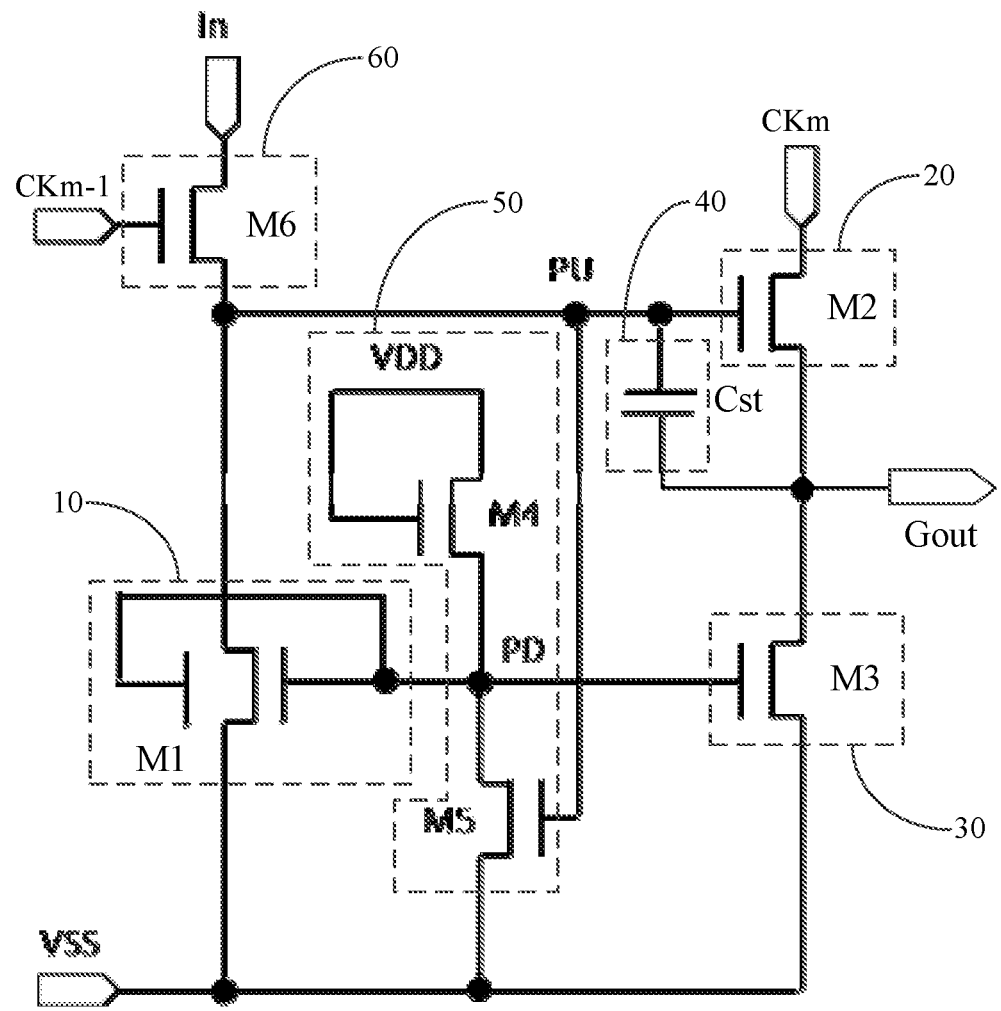
FIG. 6 is a schematic diagram of a first circuit structure of a shift register unit provided by an embodiment of the present disclosure.

Referring to FIG. 2 and FIG. 6, an embodiment of the present disclosure provides a display substrate including a gate driving circuit, wherein the gate driving circuit includes a plurality of shift register units, and the shift register units include a pull-up node PU, a pull-down node PD and abpull-up control sub-circuit 10; the pull-up control sub-circuit 10 includes:

a first dual-gate transistor M1, a first gate electrode of the first dual-gate transistor M1 and a second gate electrode of the first dual-gate transistor M1 are respectively coupled to the pull-down node PD, a first electrode of the first dual-gate transistor M1 is coupled to the pull-up node PU, and a second electrode of the first dual-gate transistor M1 is coupled to a first level signal input terminal (connected to a negative power signal VSS or VGL).

Exemplarily, the display substrate includes a display area and a non-display area surrounding the display area, and the gate driving circuit is arranged in the non-display area. The display area includes a plurality of sub-pixels, and the plurality of sub-pixels are arranged in an array. The sub-pixel includes a pixel circuit capable of controlling the display of the sub-pixel.

Exemplarily, the plurality of sub-pixels are divided into a plurality of rows of sub-pixels, and the driving signal output terminal Gout of the shift register unit is coupled to a row of pixel circuits included in a corresponding row of sub-pixels, and is configured to output a gate driving signal to the pixel circuit.

Exemplarily, a potential of the pull-up node PU is opposite to a potential of the pull-down node PD.

The pull-up control sub-circuit 10 includes a first dual-gate transistor M1, and the specific structure of the first dual-gate transistor M1 is various. Exemplarily, as shown in FIG. 2, the first double-gate transistor M1 includes a first gate electrode and a second gate electrode, and one of the first gate electrode and the second gate electrode is located below an active layer as the bottom gate BG, the other one of the first gate electrode and the second gate electrode is located above the active layer as the top gate TG. An orthographic projection of the active layer on the base substrate of the display substrate at least partially overlaps an orthographic projection of the first gate electrode on the base substrate, and the orthographic projection of the active layer on the base substrate at least partially overlaps an orthographic projection of the second gate electrode on the base substrate.

In more detail, an N-type thin film transistor is taken as an example. When the thin film transistor is in an off state, a low voltage is input to the top gate, and the Vth of the thin film transistor becomes larger, which can better turn off the thin film transistor, avoid false turning-on, and reduce leakage current. When the thin film transistor is in an on state, a high voltage is input to the top gate, and the Vth of the thin film transistor will become smaller, so that the on-state current of the thin film transistor will become larger. Therefore, through this dual-gate technology, the Vth of the thin film transistor can be dynamically adjusted according to the on/off state of the thin film transistor, so as to achieve better turning-off, reduce leakage current and increase on-state current.

It is a schematic diagram of the film layer structure of the double-gate transistor. It should be noted that the specific structures of the double-gate transistors shown are various, and an exemplary structure is given below.

Each layer is formed on the base substrate in sequence and with a certain pattern shape: a bottom gate (BG), a gate insulating layer, an active layer, a source layer, a drain layer, a passivation insulating layer, a pixel electrode and a top gate (TG). Compared with the conventional thin film transistor, the top gate is added, and the added top gate is above the bottom gate, so when the double gate transistor is applied to the sub-pixel, the aperture ratio of the pixel will not be reduced.

As shown in FIG. 2, it is a circuit symbol diagram of a double-gate thin film transistor. There are four ports, top gate TG, bottom gate BG and source electrode S and drain electrode D, respectively.

Figure 3:
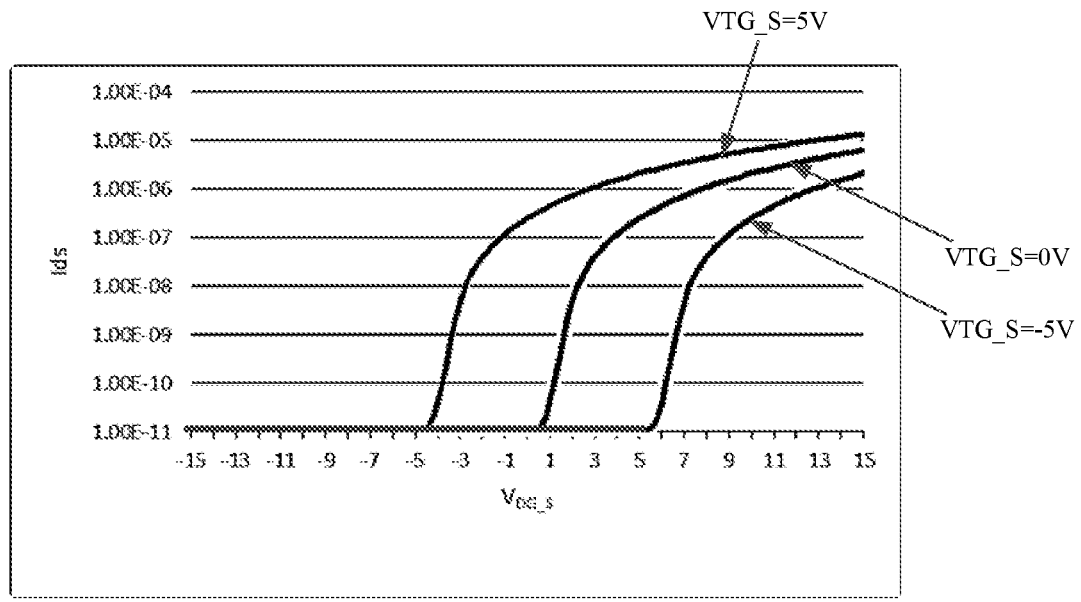
FIG. 3 is a schematic diagram of a curve of the influence of a top gate voltage on a current according to an embodiment of the present disclosure.

As shown in FIG. 3, it is the transfer output curve current (Ids) of the dual-gate thin film transistor under the influence of different top gate voltages. Traditional thin film transistors have three ports, which will form two voltages that need to be paid attention to, namely: a bottom gate-source voltage (VBG_S) and a source-drain voltage (VDS), these two voltages will directly affect the current of the thin film transistor. In addition to the above two voltages, the double-gate thin film transistor will also form an additional voltage top gate-source voltage (VTG_S). It can be found from FIG. 3 that when the top gate VTG_S=5V, the current Ids of the double-gate TFT moves to the left as a whole; and when the top gate VTG_S=−5V, the current of the double-gate TFT moves to the right as a whole. When VTG_S>0V, the Vth of the double-gate thin film transistor drifts negatively: when VTG_S<0V, the Vth of the double-gate thin film transistor drifts positively. The Vth drift of the double-gate TFT is negatively correlated with VTG_S, that is, within a certain range, the larger the positive value of VTG_S is, the more negative drift of Vth is: the smaller the negative value of VTG_S is, the more positive drift of Vth is. Therefore, the Vth of the double-gate thin film transistor can be controlled by controlling the top gate voltage of the double-gate thin film transistor. It should be noted that the abscissa $V_{DG\_S}$ in FIG. 3 represents the Vgs corresponding to the bottom gate, that is, the difference between the voltage Vg of the bottom gate and the source voltage Vs, and the Vgs corresponding to the bottom gate ranges from −15V to +15V.

Figure 4:
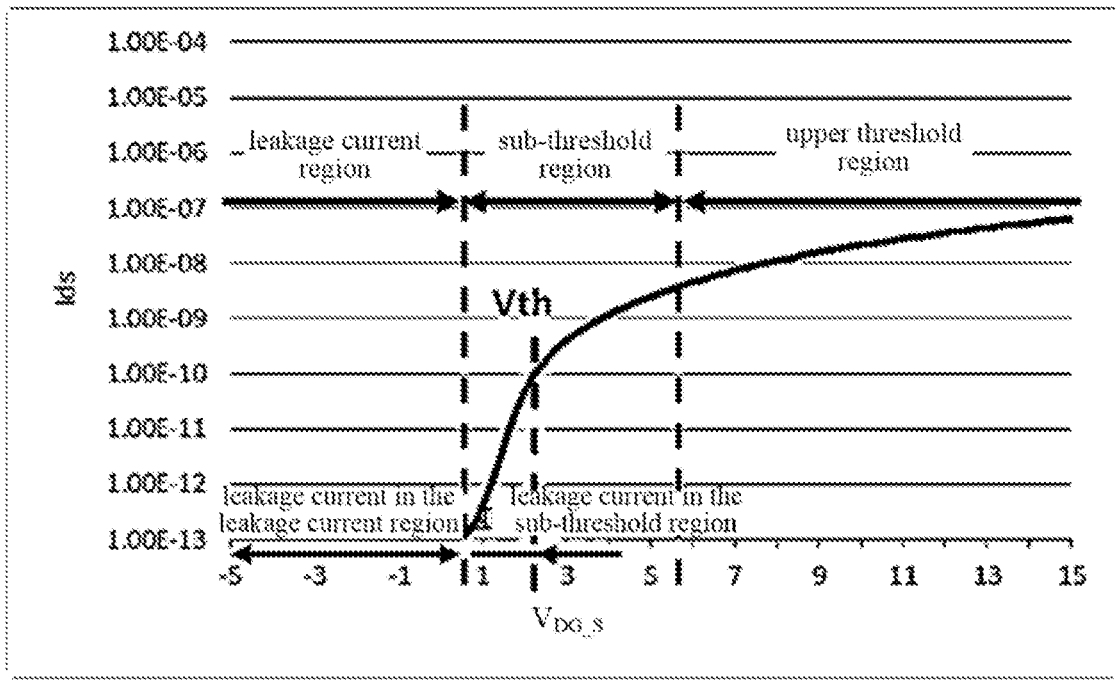
FIG. 4 is a schematic diagram of a distribution of a leakage current in various regions according to an embodiment of the present disclosure.

As shown in FIG. 4, it is a schematic diagram of the transfer curve and leakage current analysis of the thin film transistor. The transfer curve can be divided into three parts, corresponding to three regions: a leakage current region, a sub-threshold region and an upper threshold region. According to the Vgs voltage applied to the thin film transistor, leakage current is generally considered to occur in the leakage current region and the sub-threshold region. The leakage current in the leakage current region is small; and the sub-threshold region can be divided into two parts: an on-state current part where Vgs is greater than Vth and the sub-threshold region where Vgs is lower than Vth. It can be considered that Vth is equal to the voltage of Vgs when the current Ids of the thin film transistor (after normalization) is 10 nA. It can be found that the leakage current in the leakage current region is relatively small, while the leakage current in the sub-threshold region is relatively large. If the positive drift of Vth of the double-gate thin film transistor is controlled through the double-gate technology, so that the Vgs applied to the thin-film transistor falls in the leakage current region and is far away from the sub-threshold region, thereby effectively avoiding the false turning-on of the thin-film transistor, and effectively reducing leakage current. Likewise, if the Vth negative drift of the double-gate thin film transistor is controlled, the on-state current of the thin film crystal can be effectively increased. It should be noted that the abscissa $V_{DG\_S}$ in FIG. 4 represents the Vgs corresponding to the bottom gate, that is, the difference between the bottom gate voltage Vg and the source voltage Vs, and the Vgs corresponding to the bottom gate ranges from −5V to +15V.

Notably, normalization is the measured on-state current Ids divided by the width to length ratio of the channel of the device. The 10 nA value is obtained after the on-state current Ids of the device is normalized, the Vgs of the device at this time at 10 nA is used as the threshold voltage Vth.

Figure 7:
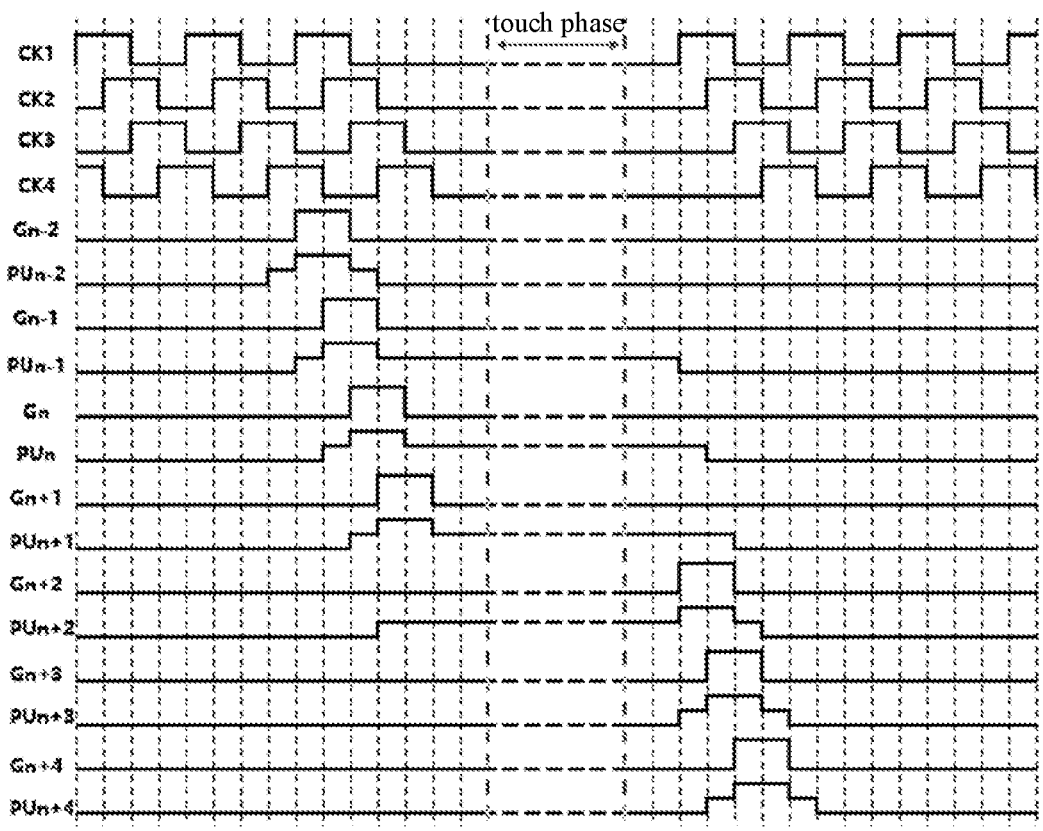
FIG. 7 is a timing diagram of a shift register unit provided by an embodiment of the present disclosure.

As shown in FIG. 7, take the gate driving circuit using four clock signal lines (CK1, CK2, CK3 and CK4) as an example, the duty cycle is 50%, it can also be 8 clock signal lines, 12 clock signal lines, 16 clock signal lines, etc., an even number of clock signal lines greater than or equal to 2 can be used, which is not limited here.

Each stage of shift register unit is connected to a corresponding clock signal in turn. For example, the Gn−2 stage of shift register unit is connected to CK1, the Gn−1 stage of shift register unit is connected to CK2, the Gn stage of shift register unit is connected to CK3, and the Gn stage of shift register unit is connected to CK3. The Gn+1 stage of shift register unit is connected to CK4, and so on, the four stages of shift register units are connected to the clock signals of one cycle. It should be noted that PUn−2 to PUn+4 in FIG. 7 represent the pull-up nodes in each stage of the shift register unit. Gn−2 to Gn+4 in FIG. 7 represent the driving signal output terminals in each stage of the shift register units.

At the same time, it should be noted that there is a touch phase in FIG. 7. In the touch phase, the GOA circuit needs to be suspended to collect touch signals. At this time, the clock signal requires the pulse signal to be suspended, which is set to a constant-voltage low-voltage signal (Such as: VGL signal), after the touch phase is completed, the clock signal can return to the normal pulse signal. In this way, the pull-up node PU of some shift register units is inevitably required to store a high voltage during the touch phase, and the GOA circuit can continue to work normally after the touch phase ends. In FIG. 7, the pull-up nodes PU in the Gn−1 stage of shift register unit, the Gn stage of shift register unit, the Gn+1 stage of shift register unit and the Gn+2 stage of shift register unit store high voltage in the touch phase, which is called a pit stop phase; and the pull up nodes PU of most of the shift register units are at a low voltage during the touch phase.

Figure 5:
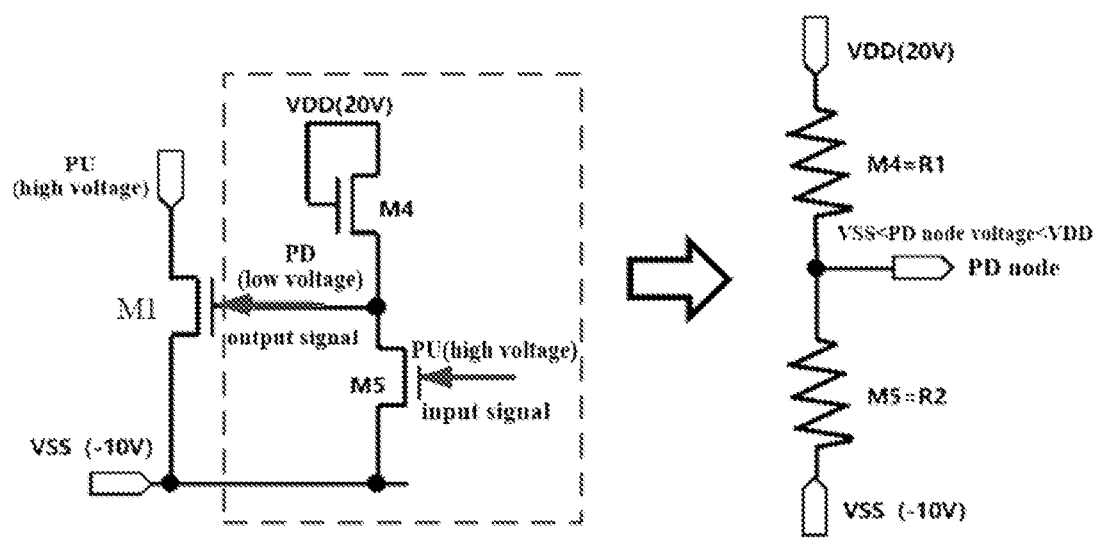
FIG. 5 is an equivalent schematic diagram of a pull-down control sub-circuit provided by an embodiment of the present disclosure.

FIG. 5 is a specific structural diagram of the pull-down control sub-circuit 50 in the above-mentioned shift register unit, and an equivalent circuit diagram of the pull-down control sub-circuit 50. The pull-down control sub-circuit 50 includes a fourth transistor M4 and a fifth transistor M5.

The fourth transistor M4 and the fifth transistor M5 form an inverter, the input signal is the voltage of the pull-up node PU, the output signal is the voltage of the pull-down node PD, and the pull-down node PD is connected to the gate electrode of the first dual-gate transistor M1 that maintains the pull-up node PU. It is assumed here that the VDD (positive power supply signal) is a constant voltage high voltage of 20V, and the VSS (negative power supply signal) is a constant voltage low voltage of −10V. In the pit stop stage during the touch phase, the pull-up node PU is at a high voltage, so that the fourth transistor M4 and the fifth transistor M5 are turned on at the same time, VDD and VSS form a path, and the fourth transistor M4 and the fifth transistor M4 M5 can be equivalent to two resistors with different resistance values (such as R1 and R2), and the voltage of the pull-down node PD depends on the ratio of the two equivalent resistances of the fourth transistor M4 and the fifth transistor M5. According to simple physical and electrical knowledge, the voltage of the pull-down node PD will be greater than the VSS and less than the VDD. Although the equivalent resistance can be adjusted by adjusting the channel width to length ratio of the fourth transistor M4 and the fifth transistor M5, the pull-down node PD will definitely be greater than the VSS, which is assumed to be −8V. In this way, for the first dual-gate transistor M1, the gate voltage is −8V of the pull-down node PD, the source voltage is the VSS voltage −10V, and the drain voltage is the high voltage of the pull-up node PU, and the gate-source voltage of the first dual-gate transistor M1 Vgs=$V_{PD}$−VSS=2V. If the Vth of the first dual-gate transistor M1 is less than 2V, the first dual-gate transistor M1 is in an on state, the high voltage of the pull-up node PU will be leaked out soon, and the GOA circuit cannot continue to work normally after the pit stop stage: The Vgs voltage applied to the first dual-gate transistor M1 falls in the sub-threshold region leakage current. Generally speaking, the pit stop time is long, for example, about 200 microseconds, which is enough to leak out the voltage of the pull-up node PU, even if the voltage of the pull-up node PU in the pit stop stage is not leaked out, the problem of the voltage difference between the pull-up node PU in the pit stop stage and the pit non-stop stage will likely cause pit patterns. Only when the Vgs voltage applied to the first dual-gate transistor M1 falls in the leakage current region, the pit stop time can be safely passed, and the normal operation of the GOA circuit can be ensured.

According to the above analysis, for the shift register unit in the pit stop stage, during the pit stop time, the Vth of the first dual-gate transistor M1 should be as large as possible, so that the voltage of Vgs applied to the first dual-gate transistor M1 should be smaller than the Vth of the first dual-gate transistor M1, it is preferable to fall within the leakage current region of the transfer curve of the first dual-gate transistor M1. It is worth noting that the Vth of traditional thin film transistors cannot be adjusted after the display panel process is completed, and the Vth of all thin film transistors on the display panel can only be made smaller or larger as a whole during the process of manufacturing the display panel. If the overall Vth is deliberately made too positive and too large in the process, problems such as insufficient maintenance of the potential of the pull-up node PU and the driving signal output terminal Gout, and insufficient pixel charging rate will occur on the display panel.

The pull-up control sub-circuit 10 includes the first dual-gate transistor M1, the Vth of the first dual-gate transistor M1 can be dynamically adjusted in a positive or negative direction according to requirements. For the pit stop stage and during the touch phase, the pull-up node PU is at a high voltage, while the pull-down node PD is at a low voltage, and the top gate electrode of the first dual-gate transistor M1 is connected to the pull-down node PD, so that Vth of the first double-gate transistor M1 becomes larger, which can greatly increase the voltage range in the leakage current region of the transfer curve of the first dual-gate transistor M1. Exemplarily, the Vth of the first dual-gate transistor M1 is originally 3V, the Vgs voltage range of the leakage current entering the sub-threshold region is 0V to 3V, and the Vgs voltage range entering the leakage current region is less than 0V. If the Vgs of the first dual-gate transistor M1 is 2V at this time, the conventional thin film transistor device enters the sub-threshold region leakage current, and the leakage current of the pull-up node PU will occur as described above. However, if the first dual-gate transistor M1 with adjustable Vth is used, the top gate is connected to the voltage of the pull-down node PD. In the pit stop stage and during the touch phase, since the pull-down node PD is at a negative voltage, such as −8V, the Vth of the first dual-gate transistor M1 will increase, such as 10V, and the Vgs voltage entering the sub-threshold region and the leakage current region will also be correspondingly larger, e.g. 7V to 10V and less than 7V, respectively. Since there are no other changes in the circuit, the voltage Vgs applied to the first dual-gate transistor M1 is unchanged, still is 2V, which falls in the leakage current region of the first dual-gate transistor M1, which is far less than Vgs voltage of 7V entering the sub-threshold region. In this way, the reliability of the GOA circuit is further improved, and the tolerance range of the Vgs positive voltage applied to the first dual-gate transistor M1 during the touch phase is improved.

In addition, for the pit non-stop stage in the touch phase and the non-touching phase, when the pull-up node PU in the shift register unit is at a low voltage, the pull-down node PD is at a high voltage, and the top gate electrode of the first dual-gate transistor M1 is connected to the pull-down node PD, so the Vth of the first dual-gate transistor M1 will become smaller, for example, from 2V to −5V, it can be seen that the current Ids through the first dual-gate transistor M1 will increase at this time, thus increasing the ability of the first dual-gate transistor M1 for maintaining the pull-up node PU at the low voltage.

To sum up, the pull-up control sub-circuit 10 includes the first dual-gate transistor M1, and can automatically adjust the Vth of the first dual-gate transistor M1 in time, thereby reducing leakage current or increasing on-state current. For the pit stop stage in the touch phase, the leakage current of the first dual-gate transistor M1 is reduced, the reliability of the GOA circuit is improved, and the tolerance range of the Vgs positive voltage applied to the first dual-gate transistor M1 is improved. For the pit non-stop stage in the touch phase and non-touching phase, for the shift register unit whose pull-up node PU is a low voltage during normal operation, the on-state current of the first dual-gate transistor M1 is increased, so that the first dual-gate transistor M1 maintains the pull-up node PU in a better way.

Therefore, in the display substrate provided by the embodiment of the present disclosure, the pull-up control sub-circuit 10 includes the first dual-gate transistor M1. When the pull-up node PU is at a high voltage and the pull-down node PD is at a low voltage, Vth of the first dual-gate transistor M1 can positively drift. For the pit stop stage in the touch phase, the charge stored on the pull-up node PU will be less leaked through the first dual-gate transistor M1, which ensures that the shift register unit can continue to work normally after the pit stop stage.

Figure 8:
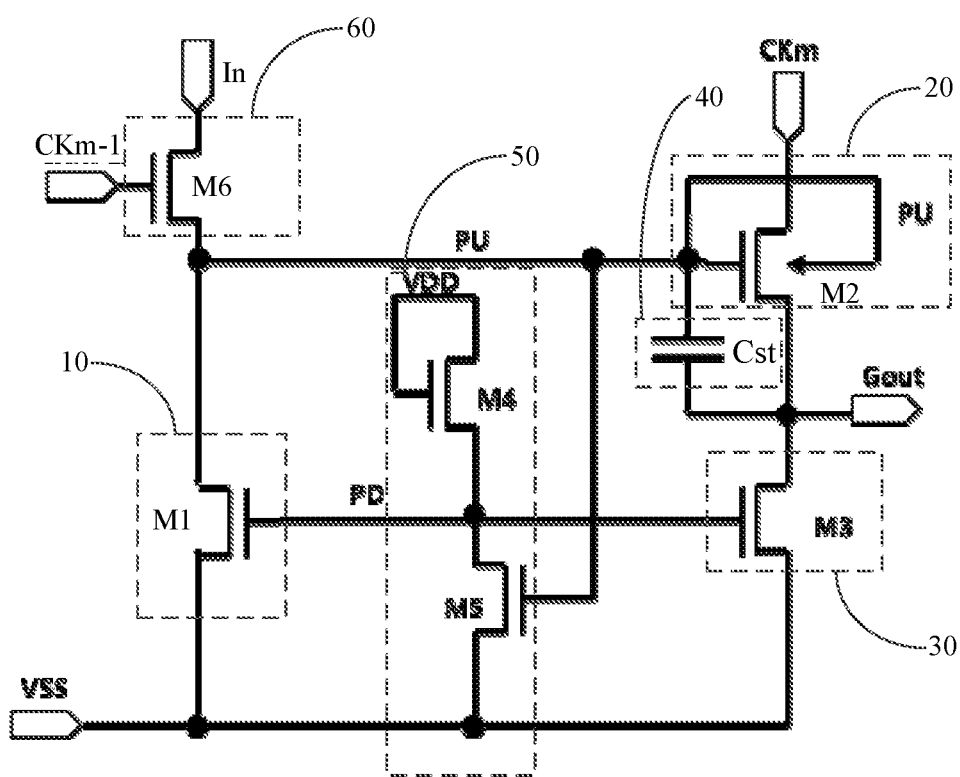
FIG. 8 is a schematic diagram of a second circuit structure of a shift register unit provided by an embodiment of the present disclosure.

As shown in FIG. 8, in some embodiments, the shift register unit further includes an output control sub-circuit 20, and the output control sub-circuit 20 includes a second dual-gate transistor M2, and the first gate electrode of the second dual-gate transistor M2 and the second gate electrode of the second dual-gate transistor M2 are respectively coupled to the pull-up node PU, and the first electrode of the second dual-gate transistor M2 is coupled to the corresponding clock signal input terminal CKm, the second electrode of the second double gate transistor M2 is coupled to the driving signal output terminal Gout of the shift register unit.

Exemplarily, m takes any one of values from 1 to 4.

The output control sub-circuit 20 includes a second double-gate transistor M2, and the specific structure of the second double-gate transistor M2 is various. Exemplarily, the second double-gate transistor M2 includes a first gate electrode and a second gate electrode, one of the first gate electrode and the second gate is located under the active layer, and serves as a bottom gate, the other one of the first gate electrode and the second gate electrode is located above the active layer, and serve as a top gate. The orthographic projection of the active layer on the base substrate of the display substrate at least partially overlaps the orthographic projection of the first gate electrode on the base substrate, and the orthographic projection of the active layer on the base substrate at least partially overlaps the orthographic projection of the second gate electrode on the base substrate 70.

Figure 9:
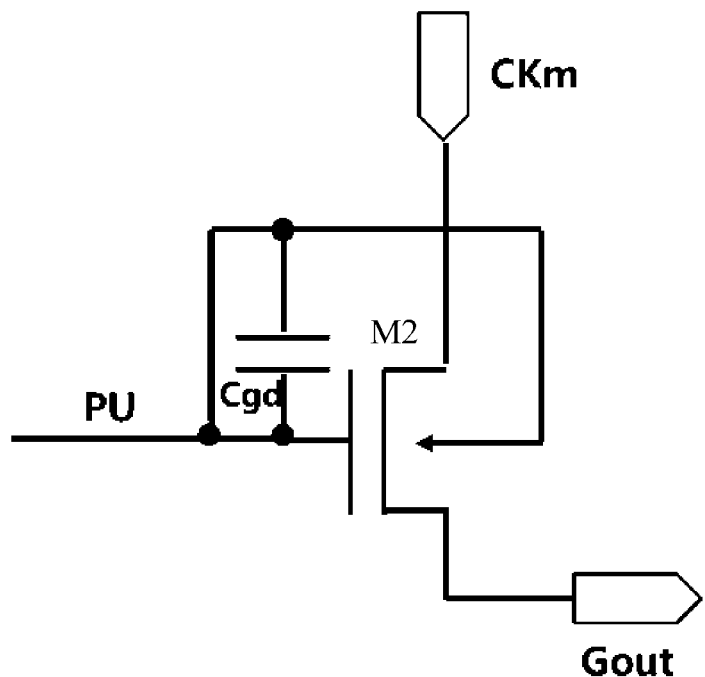
FIG. 9 is a schematic diagram of a parasitic capacitor generated by a second dual-gate transistor provided in an embodiment of the present disclosure.
Figure 10:
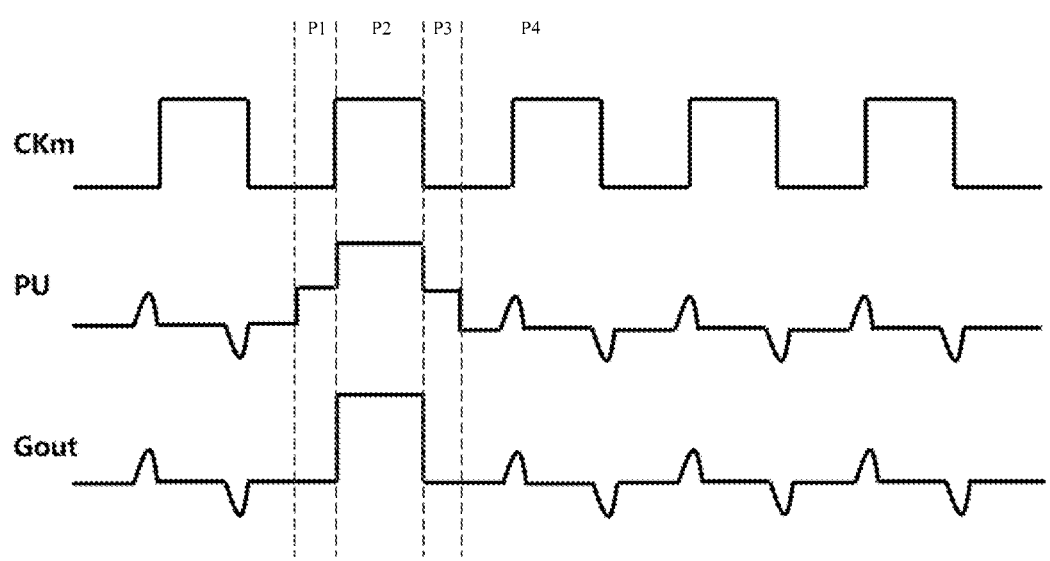
FIG. 10 is a timing diagram of a second dual-gate transistor according to an embodiment of the present disclosure.

FIG. 9 is a double-gate structure diagram of the second double-gate transistor M2. FIG. 10 is a waveform diagram of signals inputted or outputted by the ports of the second dual-gate transistor M2. Exemplarily, the first gate electrode and the second gate electrode of the second dual-gate transistor M2 are connected to the pull-up node PU signal, the drain electrode of the second dual-gate transistor M2 is connected to the corresponding clock signal CKm, and the source electrode of the second dual-gate transistor M2 is coupled to the driving signal output terminal Gout, and outputs a gate driving signal.

As shown in FIG. 10, in more detail, the waveform of the voltage signal on the pull-up node PU can be divided into two parts in one frame, a high voltage part and a low voltage part. When the pull-up node PU is in a low-voltage state, the voltage of the pull-up node PU needs to be kept in a low-voltage state at this time, so as to prevent the second dual-gate transistor M2 from being false turning-on, resulting in the GOA circuit outputting a false signal.

As shown in FIG. 9 and FIG. 10, the gate electrode and drain electrode of the second dual-gate transistor M2 generally form a parasitic capacitor Cgd during process. When the clock signal changes from a low voltage to a high voltage, or from a high voltage to a low voltage, the parasitic capacitor Cgd will be coupled to the pull-up node PU or instantly pull up the voltage of the pull-up node PU, or instantly pull down the voltage of the pull-up node PU, thereby forming small peaks and valleys, the same shape as the burr, which is called ripple. When the ripple is small, the gate driving signal will also form the ripple through coupling: if the ripple of the signal of the pull-up node PU is large, the ripple will transiently apply a larger Vgs voltage on the second double-gate transistor M2, and the clock signal is at a high voltage at this time, which is very likely that the GOA circuit will be turned on by mistake, and the gate driving signal will be outputted by mistake.

In the display substrate provided in the above embodiment, the output control sub-circuit 20 is configured to include a second dual-gate transistor M2, and the top gate electrode of the second dual-gate transistor M2 is connected to the voltage of the pull-up node PU, at this time, the pull-up node PU is at a low voltage, so the Vth of the second dual-gate transistor M2 will become larger, and the Vgs voltage applied to the second dual-gate transistor M2 by the transient ripple of the pull-up node PU will be much smaller than Vth of the second dual-gate transistor M2, which greatly improve the tolerance level to the PU ripple of the pull-up node, further improves the reliability of the shift register unit.

When the pull-up node PU is at a high voltage, the second dual-gate transistor M2 is in an on state, and a large current is required to form a gate driving signal, that is, it is desirable that the current be as large as possible within a certain range. The output control sub-circuit 20 includes the second dual-gate transistor M2, so that the Vth of the second dual-gate transistor M2 will become smaller, and according to the current formula of the thin film transistor, the current will become larger, which will effectively reduce the rising time and the falling time of the gate driving signal.

To sum up, in the display substrate provided by the above embodiments, the output control sub-circuit 20 includes the second dual-gate transistor M2, and the top gate electrode of the second dual-gate transistor M2 is connected to the PU signal of the pull-up node. When the pull-up node PU is at a low voltage, the tolerance of the second dual-gate transistor M2 to the ripple of the pull-up node PU can be greatly improved, and the reliability of the GOA circuit can be improved; and when the pull-up node PU is at a high voltage, the output current of the second dual-gate transistor M2 can be increased, the rising time and falling time of the gate driving signal can be decreased.

As shown in FIG. 6 and FIG. 8, in some embodiments, the shift register unit further includes:

an output reset sub-circuit 30, wherein the output reset sub-circuit 30 is respectively coupled to the pull-down node PD, the driving signal output terminal Gout of the gate driving circuit, and the first level signal input terminal, the output reset sub-circuit 30 is configured to control to connect or disconnect the driving signal output terminal Gout and the first level signal input terminal under the control of the pull-down node PD:

A storage sub-circuit 40, a first terminal of the storage sub-circuit 40 is coupled to the pull-up node PU, and a second terminal of the storage capacitor is coupled to the driving signal output terminal Gout.

Exemplarily, during a maintenance phase, the output reset sub-circuit 30 is configured to control to connect the driving signal output terminal Gout and the first-level signal input terminal under the control of the pull-down node PD.

Exemplarily, in an input phase, an output phase and a reset phase, the output reset sub-circuit 30 is configured to control to disconnect the driving signal output terminal Gout from the first level signal input terminal under the control of the pull-down node PD.

Exemplarily, the output reset sub-circuit 30 includes a third transistor M3, a gate electrode of the third transistor M3 is coupled to the pull-down node PD, and a first electrode of the third transistor M3 is coupled to the driving signal output terminal Gout, and a second electrode of the third transistor M3 is coupled to the first level signal input terminal;

The storage sub-circuit 40 includes a storage capacitor Cst, a first terminal of the storage capacitor Cst is coupled to the pull-up node PU, and a second terminal of the storage capacitor Cst is coupled to the driving signal output terminal Gout.

Exemplarily, in the maintenance phase, the third transistor M3 is turned on, and in the input phase, the output phase and the reset phase, the third transistor M3 is turned off.

As shown in FIG. 6 and FIG. 8, in some embodiments, the shift register unit further includes: a pull-down control sub-circuit 50, the pull-down control sub-circuit 50 is respectively coupled to the pull-up node PU, the pull-down node PD, the first level signal input terminal and the second level signal input terminal, and the pull-down control sub-circuit 50 is configured to control connect or disconnect the pull-down node PD and the first level signal input terminal under the control of the pull-up node, and configured to control to connect or disconnect the pull-down node PD and the second level signal input terminal under the control of the second level signal input terminal.

Exemplarily, a negative power supply signal is written to the first level signal input terminal, and a positive power supply signal is written to the second level signal input terminal.

Exemplarily, in the input phase, the output phase and the reset phase, the pull-down control sub-circuit 50 is configured to control to connect the pull-down node PD and the first level signal input terminal under the control of the pull-up node PU, and control to connect the pull-down node PD and the second level signal input terminal under the control of the second level signal input terminal. During the maintenance phase, the pull-down control sub-circuit 50 is configured to control to disconnect the pull-down node PD from the first level signal input terminal under the control of the pull-up node PU, and to control to connect the pull-down node PD and the second level signal input terminal under the control of the second level signal input terminal.

Exemplarily, the pull-down control sub-circuit 50 includes a fourth transistor M4 and a fifth transistor M5, and a gate electrode of the fourth transistor M4 and a first electrode of the fourth transistor M4 are both coupled to the second level signal input terminal, a second electrode of the fourth transistor M4 is coupled to the pull-down node PD: a gate electrode of the fifth transistor M5 is coupled to the pull-up node PU, a first electrode of the fifth transistor M5 is coupled to the pull-down node PD, and a second electrode of the fifth transistor M5 is coupled to the first level signal input terminal.

Exemplarily, in the input phase, the output phase and the reset phase, the fourth transistor M4 and the fifth transistor M5 are both turned on. In the maintenance phase, the fourth transistor M4 is turned on, and the fifth transistor M5 is turned off.

As shown in FIG. 6 and FIG. 8, in some embodiments, the shift register unit further includes:

An input sub-circuit 60, the input sub-circuit 60 is respectively coupled to the input control terminal CKm−1, the input signal terminal In and the pull-up node PU, and the input sub-circuit 60 is configured to control to connect or disconnect the input signal terminal and the pull-up node PU under the control of the input control terminal.

Exemplarily, the input signal terminal In is connected to a signal corresponding to Gn−1 in FIG. 7.

Exemplarily, in the input phase and a first half of the output phase, the input sub-circuit 60 is configured to control to connect the input signal terminal and the pull-up node PU under the control of the input control terminal. In a second half of the output phase and the reset phase, the input sub-circuit 60 is configured to control to disconnect the input signal terminal and the pull-up node PU under the control of the input control terminal. In at least part of the maintenance phase, the input sub-circuit 60 is configured to control to disconnect the input signal terminal from the pull-up node PU under the control of the input control terminal.

Exemplarily, the input sub-circuit 60 includes a sixth transistor M6, a gate electrode of the sixth transistor M6 is coupled to the input control terminal, and a first electrode of the sixth transistor M6 is coupled to the input signal terminal, a second electrode of the sixth transistor M6 is coupled to the pull-up node PU.

In the input phase and the first half of the output phase, the sixth transistor M6 is turned on. In the second half of the output phase and the reset phase, and at least part of the maintenance phase, the sixth transistor M6 is turned off.

In the shift register unit provided by the above embodiment, the sixth transistor M6 can control the potential of the pull-up node PU. The second double-gate transistor M2 can control the driving signal output terminal Gout to output. The fourth transistor M4 and the fifth transistor M5 form an inverter, the input signal is the pull-up node PU signal, and the output signal is the pull-down node PD signal. The first dual-gate transistor M1 functions to maintain the potential of the pull-up node PU. The third transistor M3 functions to maintain the potential of the driving signal output terminal Gout.

It should be noted that, in the shift register unit provided in the above embodiments, the specific structures of the input sub-circuit 60, the pull-down control sub-circuit 50 and the output reset sub-circuit 30 are not limited to the above exemplary structures.

Figure 11:
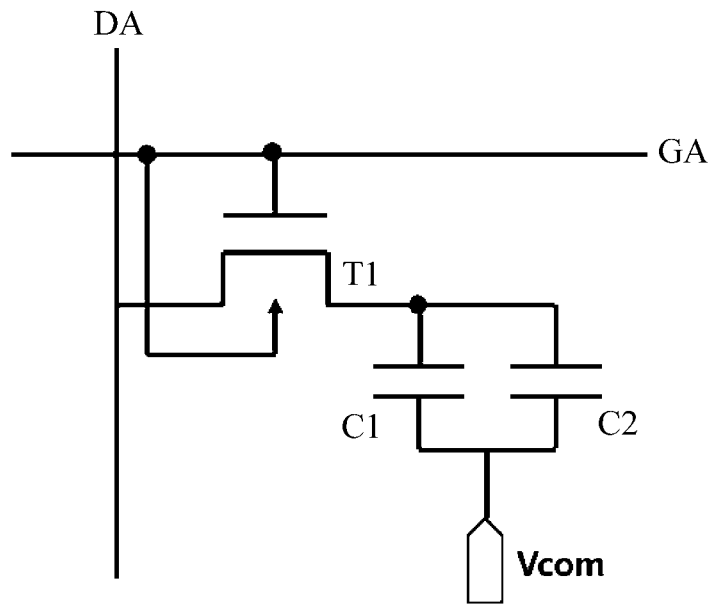
FIG. 11 is a schematic structural diagram of a pixel circuit according to an embodiment of the present disclosure.
Figure 12:
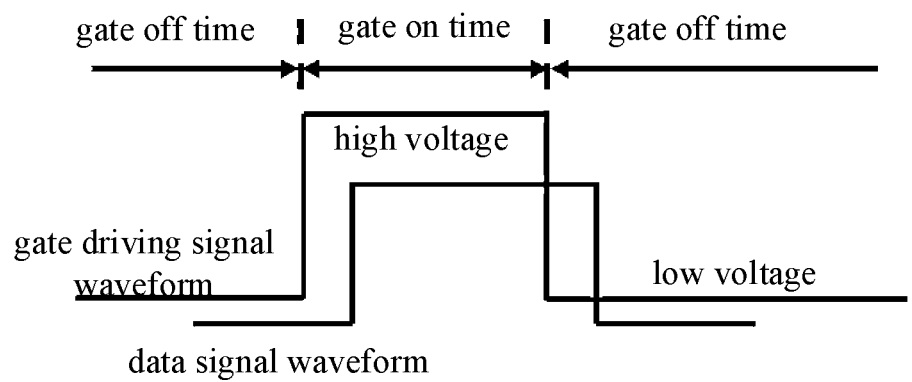
FIG. 12 is a schematic diagram of waveforms of a gate driving signal and a data signal according to an embodiment of the present disclosure.

As shown in FIG. 11 and FIG. 12, in some embodiments, the display substrate includes a plurality of gate lines GA, a plurality of data lines DA and a plurality of sub-pixels, the sub-pixel includes a pixel circuit and a pixel electrode, and the pixel circuit includes a pixel double-gate transistor T1, a first gate electrode of the pixel double-gate transistor T1 and a second gate electrode of the pixel double-gate transistor T1 are respectively coupled to corresponding gate lines GA, and a first electrode of the pixel double-gate transistor T1 is coupled to a corresponding data line DA, and a second electrode of the pixel double-gate transistor T1 is coupled to the pixel electrode.

Exemplarily, the gate line GA intersects the data line DA.

Exemplarily, the gate line GA is coupled to the corresponding shift register unit and receives a gate driving signal. The pixel double-gate transistor T1 is configured to control to connect or disconnect the data line DA and the pixel electrode under the control of the gate driving signal.

Exemplarily, the pixel double-gate transistor T1 includes a first gate electrode and a second gate electrode, one of the first gate electrode and the second gate electrode is located below the active layer, and serves as a bottom gate, and the other one of the first gate electrode and the second gate electrode are located above the active layer, and serves as a top gate. The orthographic projection of the active layer on the base substrate 70 of the display substrate at least partially overlaps the orthographic projection of the first gate electrode on the base substrate 70, and the orthographic projection of the active layer on the base substrate 70 at least partially overlaps the orthographic projection of the second gate electrode on the base substrate 70.

As shown in FIG. 11, the gate driving signal received by the first gate electrode and the second gate electrode of the pixel double-gate transistor T1 can be divided into two parts: a high voltage part and a low voltage part. At the high voltage part, the pixel thin film transistor is in an on state, and a large current is required at this time to quickly charge the pixel capacitor (including the liquid crystal capacitor C1 and the storage capacitor C2) in a short time to ensure the charging rate. The pixel circuit in the above setting includes a pixel double-gate transistor T1, and the top gate electrode of the pixel double-gate transistor T1 is connected to a gate driving signal. When the gate driving signal is at a high voltage, Vth of the pixel double-gate transistor T1 becomes smaller, and the current of the pixel double-gate transistor T1 will become larger, which is good for the charging rate. It should be noted that the other ends of the liquid crystal capacitor C1 and the storage capacitor C2 are connected to the common electrode signal Vcom.

When the gate driving signal is at a low voltage, it is necessary to ensure that the pixel double-gate transistor T1 is in an off state to avoid charging a false data signal. The above-mentioned pixel circuit includes a pixel double-gate transistor T1, and the gate driving signal connected to the top gate electrode is at a low voltage at this time, which will increase the Vth of the pixel double-gate transistor T1, so that the Vgs voltage applied to the pixel thin film transistor is much less than Vth, which can ensure that the pixel double-gate transistor T1 is turned off in a better way, and can reduce the leakage current of the data signal to the pixel capacitor.

To sum up, the pixel circuit includes a pixel double-gate transistor T1, and the top gate electrode is connected to the gate output signal. When the gate driving signal is at a high voltage, the current of the pixel double-gate transistor T1 can be increased, which ensures the charge rate of pixels in a better way. When the gate driving signal is at a low voltage, the pixel double-gate transistor T1 can be turned off in a better way to avoid charging a false data signal. Moreover, when the gate driving signal is at a low voltage, the Vth of the pixel double-gate transistor T1 becomes larger, and the tolerance to the ripple generated by the gate driving signal becomes higher, and it is not easy to turn on by mistake and charge the false data signal.

Figure 1:
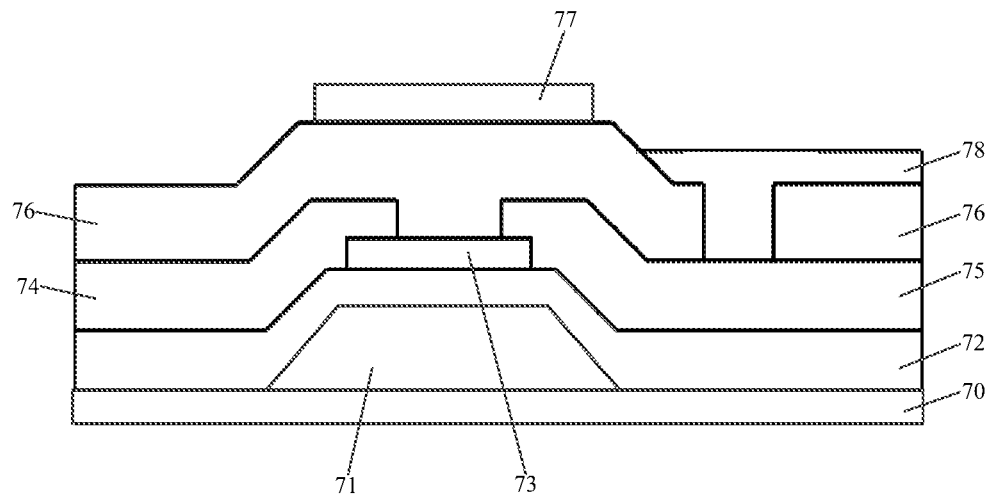
FIG. 1 is a schematic cross-sectional view of a dual-gate transistor according to an embodiment of the present disclosure.

As shown in FIG. 1, in some embodiments, the first double-gate transistor M1, the second double-gate transistor M2 and the pixel double-gate transistor T1 adopt the following structures:

A first gate electrode 71, a first insulating layer 72, an active layer 73, a source-drain metal layer (including a first electrode 74 and a second electrode 75), a second insulating layer 76 and second gate electrode 77 stacked along a direction away from the base substrate 70 of the display substrate: the orthographic projection of the active layer 73 on the substrate 70 at least partially overlaps the orthographic projection of the first gate electrode 71 on the substrate 70, the orthographic projection of the active layer 73 on the base substrate 70 at least partially overlaps the orthographic projection of the second gate electrode 77 on the base substrate 70; the source-drain metal layer forms the first electrode 74 and the second electrode 75 of the transistor, the first electrode 74 and the second electrode 75 are respectively lapped on the active layer.

Exemplarily, the first insulating layer includes a gate insulating layer, and the second insulating layer includes a passivation insulating layer.

Exemplarily, one of the first electrode and the second electrode serves as a source electrode, and the other of the first electrode and the second electrode serves as a drain electrode.

Exemplarily, an etch barrier layer may also be provided in a double-gate transistor, a part of the etch barrier layer may be arranged between the source-drain metal layer and the active layer, and the other part covers a part of the active layer that is not lapped on the source-drain metal layer.

Exemplarily, the double-gate transistor may be an N-type transistor, a P-type transistor, or a CMOS transistor.

For the double-gate transistor of the above structure, when the thin film transistor is in the off state, the top gate inputs a low voltage, the Vth of the double-gate transistor will become larger, which can better turn off the double-gate transistor, avoid the false turning-on, and reduce the leakage current. When the dual-gate transistor is in an on state, a high voltage is input to the top gate, and the Vth of the dual-gate transistor will become smaller, so that the on-state current of the dual-gate transistor will become larger. Therefore, through this dual-gate technology, the Vth of the dual-gate transistor can be dynamically adjusted according to the on/off state of the transistor, so as to achieve turning-off in a better way, reduce the leakage current and increase the on-state current.

An embodiment of the present disclosure further provides a method for driving a display substrate, which is applied to the display substrate provided by the above-mentioned embodiments, and the driving method includes:

In an input phase, an output phase and a reset phase, controlling the first dual-gate transistor M1 to be turned off by a first gate electrode and a second gate electrode of the first dual-gate transistor M1 under the control of the pull-down node PD:

In a maintenance phase, controlling the first dual-gate transistor M1 to be turned on by the first gate electrode and the second gate electrode of the first dual-gate transistor M1 under the control of the pull-down node PD.

As shown in FIG. 10, each driving period exemplarily includes an input phase P1, an output phase P2, a reset phase P3 and a maintenance phase P4 in sequence. In the output phase P2, the driving signal output terminal outputs a high level that is the same as a clock signal. In the reset phase P3, the clock signal is at a low level, and the signal outputted by the driving signal output terminal is reset.

When the driving method provided by the embodiment of the present disclosure is used to drive the display substrate provided by the above embodiment, the Vth of the first dual-gate transistor M1 can be automatically adjusted in time, thereby reducing the leakage current or increasing the on-state current. For the pit stop stage in the touch phase, the leakage current of the first dual-gate transistor M1 is reduced, the reliability of the GOA circuit is improved, and the tolerance range of the Vgs positive voltage applied to the first dual-gate transistor M1 is improved. For the pit non-stop stage in the touch phase and in non-touch phase, for the shift register unit whose pull-up node PU is a low voltage during normal operation, the on-state current of the first dual-gate transistor M1 is increased, so that the first dual-gate transistor M1 maintains the pull-up node PU in a better way.

Therefore, when the driving method provided by the embodiment of the present disclosure is used to drive the display substrate provided in the above-mentioned embodiment, when the pull-up node PU is at a high voltage and the pull-down node PD is at a low voltage, the Vth of the first dual-gate transistor M1 can be shifted in a positive direction. For the pit stop stage in the touch phase, the charge stored on the pull-up node PU will be less leaked through the first dual-gate transistor M1, which ensures that the shift register unit can continue to work normally after the pit stop stage ends.

In some embodiments, the shift register unit further includes an output control sub-circuit 20, the output control sub-circuit 20 includes a second dual-gate transistor M2, the first gate electrode of the second dual-gate transistor M2 and the second gate electrode of the second dual-gate transistor M2 are respectively coupled to the pull-up node PU, the first electrode of the second dual-gate transistor M2 is coupled to the corresponding clock signal input terminal, and the second electrode of the second dual-gate transistors M2 is coupled to the driving signal output terminal Gout of the gate driving circuit: the driving method further includes:

In the input phase, the output phase and the reset phase, controlling the second double-gate transistor to be turned on by the first gate electrode and the second gate electrode of the second double-gate transistor under the control of the pull-up node:

In the maintenance phase, controlling the second dual-gate transistor to be turned off by the first gate electrode and the second gate electrode of the second dual-gate transistor under the control of the pull-up node.

When the pull-up node PU is at a high voltage, the first gate electrode and the second gate electrode of the second dual-gate transistor M2 are controlled by the pull-up node PU to control the second dual-gate transistor M2 to be turned on; When the pull-up node PU is at a low voltage, the first gate electrode and the second gate electrode of the second dual-gate transistor M2 are controlled to turn off the second dual-gate transistor M2 under the control of the pull-up node PU.

When the display substrate is driven by the driving method provided in the above embodiment, the top gate electrode of the second dual-gate transistor M2 is connected to the signal of the pull-up node PU. When the pull-up node PU is at a low voltage, the tolerance of the second dual-gate transistor M2 on the ripple of the pull-up node PU can be greatly improved. The reliability of the GOA circuit is improved. When the pull-up node PU is at a high voltage, the output current of the second dual-gate transistor M2 can be increased, the rising time and the falling time of the gate driving signal is reduced.

In some embodiments, the display substrate includes a plurality of gate lines GA, a plurality of data lines DA and a plurality of sub-pixels, the sub-pixel includes a pixel circuit and a pixel electrode, and the pixel circuit includes a pixel double-gate transistor T1, the first gate electrode of the pixel double-gate transistor T1 and the second gate electrode of the pixel double-gate transistor T1 are respectively coupled to the corresponding gate line GA, and the first electrode of the pixel double-gate transistor T1 is connected to the corresponding data line DA, and the second electrode of the pixel double-gate transistor T1 is coupled to the pixel electrode: the driving method further includes:

In a pixel driving phase, controlling the pixel double-gate transistor T1 to be turned on by the first gate electrode and the second gate electrode of the pixel double-gate transistor T1 under the control of the corresponding gate line GA, and writing a data signal to the pixel electrode:

In a non-pixel driving phase, controlling the pixel double-gate transistor T1 to be turned off by the first gate electrode and the second gate electrode of the pixel double-gate transistor T1 under the control of the corresponding gate line GA and stopping writing the data signal to the pixel electrode.

When the display substrate is driven by the driving method provided in the above embodiment, the top gate electrode of the pixel double-gate transistor T1 is connected to the gate output signal. When the gate driving signal is at a high voltage, the current of the pixel double-gate transistor T1 can be increased, which ensures the pixel charge rate in a better way. When the gate driving signal is at a low voltage, the pixel double-gate transistor T1 can be turned off in a better way to avoid charging a false data signal. Moreover, when the gate driving signal is at a low voltage, the Vth of the pixel double-gate transistor T1 becomes larger, and the tolerance to the ripple generated by the gate driving signal becomes higher, and it is not easy to turn on by mistake and charge the false data signal.

Embodiments of the present disclosure further provide a display panel, including the display substrate provided by the above embodiments.

Exemplarily, the above-mentioned display panel includes a liquid crystal display panel and an organic light emitting diode display panel, but is not limited thereto.

In the display substrate provided by the above-mentioned embodiment, when the pull-up node is at a high voltage and the pull-down node is at a low voltage, the Vth of the first dual-gate transistor can be drifted in a positive direction. For the pit stop stage in the touch phase, the charge stored on the pull-up node will be less leaked through the first dual-gate transistor, which ensures that the shift register unit can continue to work normally after the pit stop stage ends.

In the display substrate provided by the above embodiment, the top gate electrode of the second dual-gate transistor is connected to the pull-up node signal. When the pull-up node is at a low voltage, the tolerance of the second dual-gate transistor on the ripple of the pull-up node can be greatly improved, and the reliability of the GOA circuit is improved; and when the pull-up node is at a high voltage, the output current of the second dual-gate transistor can be increased, and the rising time and the falling time of the gate driving signal can be reduced.

In the display substrate provided by the above embodiment, the top gate electrode of the pixel double-gate transistor is connected to the gate output signal. When the gate driving signal is a high voltage, the current of the pixel double-gate transistor can be increased, and the pixel charging rate can be better guaranteed. When the gate driving signal is at a low voltage, the pixel double-gate transistor can be turned off better, so as to avoid charging a false data signal. Moreover, when the gate driving signal is at a low voltage, the Vth of the pixel double-gate transistor becomes larger, and the tolerance to the ripple generated by the gate driving signal becomes higher, and it is not easy to turn on by mistake and charge the false data signal.

Therefore, when the display panel provided by the embodiment of the present disclosure includes the above-mentioned display substrate, it also has the above-mentioned beneficial effects, which will not be repeated here.

In some embodiments, the display panel further includes an opposite substrate and a liquid crystal layer, the opposite substrate is arranged opposite to the display substrate, and the liquid crystal layer is located between the opposite substrate and the display substrate.

It should be noted that the display panel can be applied to any product or component with a display function, such as televisions, monitors, digital photo frames, mobile phones, tablet computers, etc., wherein the display panel can also be combined with a flexible circuit boards, a printed circuit board and a back plane etc.

It should be noted that the "same layer" in the embodiments of the present disclosure may refer to a film layer on the same structural layer. For example, the film layers in the same layer may be a layer structure formed by using the same film forming process to form a film layer for forming a specific pattern, and then using the same mask to pattern the film layer through one patterning process. Depending on the specific pattern, one patterning process may include multiple exposure, development or etching processes, and the specific pattern in the formed layer structure may be continuous or discontinuous. These specific patterns may also be at different heights or have different thicknesses.

In each method embodiment of the present disclosure, the serial numbers of the steps cannot be used to limit the order of the steps. For those of ordinary skill in the art, the order of the steps can be changed without creative work, which is also within the protection scope of the present disclosure.

It should be noted that each embodiment in this specification is described in a progressive manner, the same and similar parts of each embodiment can be referred to each other, and each embodiment focuses on the differences from other embodiments. In particular, for the method embodiments, since they are basically similar to the product embodiments, the description is relatively simple, and for relevant parts, the part of the description of the product embodiments may be referred.

Unless otherwise defined, the technical terms or scientific terms used in the present disclosure shall have the usual meanings understood by those skilled in the art to which the present disclosure belongs. "First", "second" and similar words used in the present disclosure do not indicate any order, quantity or importance, but are only used to distinguish different components. "Comprising" or "including" and similar words mean that the elements or items appearing before the word include the elements or items listed after the word and their equivalents, without excluding other elements or items. Words such as "connected", "coupled" are not limited to physical or mechanical connections, but may include electrical connections, whether direct or indirect. "Up", "Down", "Left", "Right" and so on are only used to indicate the relative positional relationship. When the absolute position of the described object changes, the relative positional relationship may also change accordingly.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a gate driving circuit, wherein the gate driving circuit includes a plurality of shift register units, the shift register unit includes a pull-up node, a pull-down node and a pull-up control sub-circuit; the pull-up control sub-circuit includes:
a first dual-gate transistor, a first gate electrode of the first dual-gate transistor and a second gate electrode of the first dual-gate transistor being respectively coupled to the pull-down node, a first electrode of the first dual-gate transistor being coupled to the pull-up node, and a second electrode of the first dual-gate transistor being coupled to a first level signal input terminal.

2. The display substrate according to claim 1, wherein the shift register unit further comprises an output control sub-circuit, and the output control sub-circuit includes a second dual-gate transistor, and a first gate electrode of the second dual-gate transistor and a second gate electrode of the second dual-gate transistor are respectively coupled to the pull-up node, and a first electrode of the second dual-gate transistor is coupled to a corresponding clock signal input terminal, a second electrode of the second double-gate transistor is coupled to a driving signal output terminal of the shift register unit.

3. The display substrate according to claim 1, wherein the shift register unit further comprises:
an output reset sub-circuit, wherein the output reset sub-circuit is respectively coupled to the pull-down node, a driving signal output terminal of the gate driving circuit, and the first level signal input terminal, the output reset sub-circuit is configured to control to connect or disconnect the driving signal output terminal and the first level signal input terminal under the control of the pull-down node;
a storage sub-circuit, wherein a first terminal of the storage sub-circuit is coupled to the pull-up node, and a second terminal of the storage capacitor is coupled to the driving signal output terminal.

4. The display substrate according to claim 1, wherein the shift register unit further comprises a pull-down control sub-circuit, the pull-down control sub-circuit is respectively coupled to the pull-up node, the pull-down node, the first level signal input terminal and a second level signal input terminal, and the pull-down control sub-circuit is configured to control connect or disconnect the pull-down node and the first level signal input terminal under the control of the pull-up node, and configured to control to connect or disconnect the pull-down node and the second level signal input terminal under the control of the second level signal input terminal.

5. The display substrate according to claim 1, wherein the shift register unit further comprises:
an input sub-circuit, wherein the input sub-circuit is respectively coupled to an input control terminal, an input signal terminal and the pull-up node, and the input sub-circuit is configured to control to connect or disconnect the input signal terminal and the pull-up node under the control of the input control terminal.

6. The display substrate according to claim 3, wherein, the output reset sub-circuit includes a third transistor, a gate electrode of the third transistor is coupled to the pull-down node, and a first electrode of the third transistor is coupled to the driving signal output terminal, and a second electrode of the third transistor is coupled to the first level signal input terminal;
the storage sub-circuit includes a storage capacitor, a first terminal of the storage capacitor is coupled to the pull-up node, and a second terminal of the storage capacitor is coupled to the driving signal output terminal.

7. The display substrate according to claim 4, wherein the pull-down control sub-circuit includes a fourth transistor and a fifth transistor, and a gate electrode of the fourth transistor and a first electrode of the fourth transistor are both coupled to the second level signal input terminal, a second electrode of the fourth transistor is coupled to the pull-down node; a gate electrode of the fifth transistor is coupled to the pull-up node, a first electrode of the fifth transistor is coupled to the pull-down node, and a second electrode of the fifth transistor is coupled to the first level signal input terminal.

8. The display substrate according to claim 5, wherein the input sub-circuit includes a sixth transistor, a gate electrode of the sixth transistor is coupled to the input control terminal, and a first electrode of the sixth transistor is coupled to the input signal terminal, a second electrode of the sixth transistor is coupled to the pull-up node.

9. The display substrate according to claim 1, wherein the display substrate includes a plurality of gate lines, a plurality of data lines and a plurality of sub-pixels, the sub-pixel includes a pixel circuit and a pixel electrode, and the pixel circuit includes a pixel double-gate transistor, a first gate electrode of the pixel double-gate transistor and a second gate electrode of the pixel double-gate transistor are respectively coupled to corresponding gate lines, and a first electrode of the pixel double-gate transistor is coupled to a corresponding data line, and a second electrode of the pixel double-gate transistor is coupled to the pixel electrode.

10. The display substrate according to claim 1, wherein the first double-gate transistor, the second double-gate transistor and the pixel double-gate transistor adopt the following structures:
a first gate electrode, a first insulating layer, an active layer, a source-drain metal layer, a second insulating layer and a second gate electrode stacked along a direction away from a base substrate of the display substrate; an orthographic projection of the active layer on the base substrate at least partially overlaps an orthographic projection of the first gate electrode on the base substrate, the orthographic projection of the active layer on the base substrate at least partially overlaps an orthographic projection of the second gate electrode on the base substrate; the source-drain metal layer forms a first electrode and a second electrode of a transistor, the first electrode and the second electrode are respectively lapped on the active layer.

11. A method for driving a display substrate, applied to the display substrate according to claim 1, comprising:
in an input phase, an output phase and a reset phase, controlling the first dual-gate transistor to be turned off by the first gate electrode and the second gate electrode of the first dual-gate transistor under the control of the pull-down node;
in a maintenance phase, controlling the first dual-gate transistor to be turned on by the first gate electrode and the second gate electrode of the first dual-gate transistor under the control of the pull-down node.

12. The method according to claim 11, wherein the shift register unit further comprises an output control sub-circuit, the output control sub-circuit includes a second dual-gate transistor, a first gate electrode of the second dual-gate transistor and a second gate electrode of the second dual-gate transistor are respectively coupled to the pull-up node, a first electrode of the second dual-gate transistor is coupled to a corresponding clock signal input terminal, and a second electrode of the second dual-gate transistors is coupled to a driving signal output terminal of the gate driving circuit; the method further includes:
in the input phase, the output phase and the reset phase, controlling the second double-gate transistor to be turned on by the first gate electrode and the second gate electrode of the second double-gate transistor under the control of the pull-up node;
in the maintenance phase, controlling the second dual-gate transistor to be turned off by the first gate electrode and the second gate electrode of the second dual-gate transistor under the control of the pull-up node.

13. The method according to claim 11, wherein the display substrate includes a plurality of gate lines, a plurality of data lines and a plurality of sub-pixels, the sub-pixel includes a pixel circuit and a pixel electrode, and the pixel circuit includes a pixel double-gate transistor, a first gate electrode of the pixel double-gate transistor and a second gate electrode of the pixel double-gate transistor are respectively coupled to a corresponding gate line, and a first electrode of the pixel double-gate transistor is connected to a corresponding data line, and a second electrode of the pixel double-gate transistor is coupled to the pixel electrode; the method further includes:

in a pixel driving phase, controlling the pixel double-gate transistor to be turned on by the first gate electrode and the second gate electrode of the pixel double-gate transistor under the control of the corresponding gate line;

in a non-pixel driving phase, controlling the pixel double-gate transistor to be turned off by the first gate electrode and the second gate electrode of the pixel double-gate transistor under the control of the corresponding gate line.

14. A display panel comprising the display substrate according to claim 1.

15. The display panel according to claim 14, wherein the display panel further comprises an opposite substrate and a liquid crystal layer, the opposite substrate is arranged opposite to the display substrate, and the liquid crystal layer is arranged between the opposite substrate and the display substrate.

16. The display panel according to claim 14, wherein the shift register unit further comprises an output control sub-circuit, and the output control sub-circuit includes a second dual-gate transistor, and a first gate electrode of the second dual-gate transistor and a second gate electrode of the second dual-gate transistor are respectively coupled to the pull-up node, and a first electrode of the second dual-gate transistor is coupled to a corresponding clock signal input terminal, a second electrode of the second double-gate transistor is coupled to a driving signal output terminal of the shift register unit.

17. The display panel according to claim 14, wherein the shift register unit further comprises:

an output reset sub-circuit, wherein the output reset sub-circuit is respectively coupled to the pull-down node, a driving signal output terminal of the gate driving circuit, and the first level signal input terminal, the output reset sub-circuit is configured to control to connect or disconnect the driving signal output terminal and the first level signal input terminal under the control of the pull-down node;

a storage sub-circuit, wherein a first terminal of the storage sub-circuit is coupled to the pull-up node, and a second terminal of the storage capacitor is coupled to the driving signal output terminal.

18. The display panel according to claim 14, wherein the shift register unit further comprises a pull-down control sub-circuit, the pull-down control sub-circuit is respectively coupled to the pull-up node, the pull-down node, the first level signal input terminal and a second level signal input terminal, and the pull-down control sub-circuit is configured to control connect or disconnect the pull-down node and the first level signal input terminal under the control of the pull-up node, and configured to control to connect or disconnect the pull-down node and the second level signal input terminal under the control of the second level signal input terminal.

19. The display panel according to claim 14, wherein the shift register unit further comprises:

an input sub-circuit, wherein the input sub-circuit is respectively coupled to an input control terminal, an input signal terminal and the pull-up node, and the input sub-circuit is configured to control to connect or disconnect the input signal terminal and the pull-up node under the control of the input control terminal.

20. The display panel according to claim 17, wherein, the output reset sub-circuit includes a third transistor, a gate electrode of the third transistor is coupled to the pull-down node, and a first electrode of the third transistor is coupled to the driving signal output terminal, and a second electrode of the third transistor is coupled to the first level signal input terminal;

the storage sub-circuit includes a storage capacitor, a first terminal of the storage capacitor is coupled to the pull-up node, and a second terminal of the storage capacitor is coupled to the driving signal output terminal.

* * * * *